United States Patent
Rudolf et al.

(10) Patent No.: US 6,218,000 B1
(45) Date of Patent: Apr. 17, 2001

(54) MICROPOROUS POLYTETRAFLUOROETHYLENE (PTFE) BODIES WITH FILLER

(76) Inventors: Christiane Rudolf, Bachingerstr. 6, 85435 Erding; Wolfgang Burger, Bocklerweg 30, 81825 Munich; Ralf Tillmanns, Am Einsiedel 44, 91785 Pleinfeld, all of (DE)

(*) Notice: Subject to any disclaimer, the term of this patent is extended or adjusted under 35 U.S.C. 154(b) by 0 days.

(21) Appl. No.: 09/077,697

(22) PCT Filed: Nov. 29, 1996

(86) PCT No.: PCT/EP96/05305

§ 371 Date: Sep. 21, 1998

§ 102(e) Date: Sep. 21, 1998

(87) PCT Pub. No.: WO97/20881

PCT Pub. Date: Jun. 12, 1997

(30) Foreign Application Priority Data

Dec. 1, 1995 (DE) ................................. 195 44 912

(51) Int. Cl.[7] ................................. B32B 3/26; C08J 5/18
(52) U.S. Cl. .............. 428/317.9; 264/122; 264/127; 264/175; 264/290.2; 428/338
(58) Field of Search ................ 428/317.9, 338; 264/122, 127, 175, 290.2

(56) References Cited

U.S. PATENT DOCUMENTS

| | | |
|---|---|---|
| 4,153,661 | 5/1979 | Ree . |
| 4,187,390 | 2/1980 | Gore . |
| 4,194,040 | 3/1980 | Breton et al. . |
| 4,985,290 | 1/1991 | Lewis et al. . |
| 5,376,441 | 12/1994 | Wu et al. . |
| 5,385,694 | 1/1995 | Wu et al. . |
| 5,460,872 | 10/1995 | Wu et al. . |

FOREIGN PATENT DOCUMENTS

| | | |
|---|---|---|
| 3433879 A1 | 3/1986 | (DE) . |
| WO 93/07179 | 10/1992 | (DE) . |
| 0 023 047 | 1/1981 | (EP) . |
| 0 402 901 | 12/1990 | (EP) . |
| 0 437 721 A1 | 7/1991 | (EP) . |
| 0 443 400 A1 | 8/1991 | (EP) . |
| 2 071 112 | 9/1981 | (GB) . |
| 63-11979 | 4/1988 | (JP) . |
| 2045328 C1 | 10/1995 | (RU) . |
| 131756 | 11/1951 | (SU) . |
| 331518 | 4/1972 | (SU) . |
| 358818 | 1/1973 | (SU) . |
| 468796 | 8/1975 | (SU) . |
| 1016334 | 5/1983 | (SU) . |
| WO 90/10673 | 9/1990 | (WO) . |

Primary Examiner—Blaine Copenheaver
(74) Attorney, Agent, or Firm—Carol A. Lewis White (57) ABSTRACT

A membrane of microporous, for example stretched, PTFE is filled with particles having a size in the nanometer range. By filling with, for example, $TiO_2$, the abrasion resistance of the membrane can be increased. Low particle size means that the original structure of the PTFE membrane with its knots and fibrils is retained, as is, consequently, the original desired properties of this material. In addition to these properties, filling of the material achieves additional properties, for example increased abrasion resistance.

15 Claims, 7 Drawing Sheets

MICROPOROUS POLYTETRAFLUOROETHYLENE (PTFE) BODIES WITH FILLER

PTFE article comprising microporous polytetrafluoroethylene with a filler, and process for the production thereof

BACKGROUND OF THE INVENTION

The invention relates to a PTFE article comprising microporous PTFE, for example stretched polytetrafluoroethylene (ePTFE), with a filler, and to a process for the production of a PTFE article of this type.

Polytetrafluoroethylene (PTFE) has been used for a variety of purposes owing to its special properties. For certain applications, PTFE is provided with a filler in order to modify the properties of the PTFE for the particular application. For example, U.S. Pat. No. 4,949,284 (Arthur et al) discloses introducing a ceramic filler ($SiO_2$) and a small amount of glass microfibers with a particle size of 10–15 $\mu$m into PTFE material. This material is used for the production of printed wiring boards (PWBs).

The ceramic filler improves the dimensional stability compared with PTFE/glass fiber composites. In general, these substances are nonporous.

A special way of processing PTFE provides a porous material. Paste extrusion of PTFE material and stretching of the extruded material at a temperature of up to about 330° C. followed by sintering above the crystalline melting point of the PTFE material provides a porous PTFE structure composed of nodes connected by fibrils. This PTFE is expanded by stretching and will be referred to as ePTFE. The stretching is carried out, for example, at a rate of 10%/second. The extent to which the material is stretched determines its density (specific gravity).

Upon paste extrusion and stretching an ePTFE membrane is obtained which is permeable to air and water vapor, but impermeable to liquid water. The material can be shaped and then used, in sintered or unsintered form, as a sealant material. The material can be laminated, i.e. provided on one or both sides with one or more layers, to give multilayer materials. Numerous applications of such materials are known from the prior art.

For specific applications, it is known to fill such porous PTFE (ePTFE) with a filler in order to achieve certain mechanical, physical, chemical or electrical properties. EP-A-0 463 106 (Mortimer) discloses a film and the production thereof by mixing ~PTFE with a filler. The fillers given are, for example, aluminium oxide, titanium dioxide, glass fibers, carbon black, activated charcoal and the like. Filler particles have a size between 1 and 100 $\mu$m. In general, the proportion of the filler is greater than 25% by vol.

EP-A-0 463 106 (U.S. Pat. No. 4,985,290) discloses more specifically a filled PTFE film having a thickness of between 2.5 and 127 $\mu$m, where the filler has a size of less than 40 $\mu$m, preferably 1–15 $\mu$m. During the production process, the film formed by paste extrusion and/or calendering is stretched and then compressed to the desired thickness. The compression not only achieves the desired film thickness and reduces the porosity, but also serves to fix the fillers. The film can of course not be thinner than the diameter of the ceramic filler particles. If the film is to be 3 $\mu$m thick, virtually no filler particles may be larger than 3 $\mu$m in diameter.

Although, for example, the electrical properties of expanded porous PTFE (ePTFE) can be affected by addition of carbon/metal particles, the original mechanical properties of this porous PTFE suffer to the extent to which the proportion of filler is increased. The filler particles represent defects in the abovementioned node/fibril structure which modify the properties of the unfilled ePTFE.

EP-A-0 443 400 (Arthur) discloses introducing inorganic particles into unstretched (nonporous) PTFE in order, for example, to reduce the dielectric constant. The filler particles may be coated.

U.S. Pat. No. 4,153,661 (Ree Buren et al.) discloses a PTFE article containing a filler, for example titanium oxide; the particle size given is in the range from 100 nanometers to 600 $\mu$m, preferably from 1 $\mu$m to 100 $\mu$m. Firstly, PTFE and filler are mixed and processed further to produce fibrils in the material. The material is then subjected to biaxial calendering. A PTFE material of this type is unstretched and cannot be stretched further after said processing steps. In order to achieve fibrillation, a relatively large particle size is desirable. Examples given are ranges from 20 to 30 $\mu$m and from 200 to 250 $\mu$m. If a membrane is produced from this material, the minimum thickness of the membrane is restricted to 20 $\mu$m by a filler having such a particle size. U.S. Pat. No. 4,194,040 discloses a film material produced using, as starting material, particles having a mean diameter of less than 10 $\mu$m. The material contains 1–15% of PTFE as matrix for fixing.

For coating substrates and the like, it is known to prepare, by polymerization of aqueous microemulsions, a latex containing particles of organic polymer with side chains having a mean particle size of between 0.01 and 0.5 $\mu$m (U.S. Pat. Nos. 5,376,441; 5,385,694 and 5,460,872, Wu et al.). The latex material can serve to cover the walls of porous substrates; the latex material is not bound into the structure.

For example, EP-A-0 437 721 (Tamaru et al.) discloses a semi-sintered PTFE multilayer structure containing an additive in at least one of the layers. The particle size of the additive is between 0.03 and 20 $\mu$m, preferably between 1 and 10 $\mu$m. An express warning is given against the size being below a minimum value: "If it (the particle diameter) is less than 0.03 $\mu$m, the action of the additive is inadequate, and if it is greater than 20 $\mu$m, the molding properties of the PTFE fine powder are impaired". The preferred particle size here is thus clearly above 1000 nm, apparently because a noticeable action of the filler is not expected in the case of smaller particles.

According to EP-A-0 437 721, the additive is not involved in fiber formation ("non-fiber-forming material"). This contradicts the teaching of the present invention, according to which the nanoparticles are part of the structure. According to this publication, additives having a particle size in the manometer range cannot modify the properties, for example the mechanical properties, of the material. Surprisingly, however, the inventors found that it is precisely the use of extremely small particles as filler for stretched PTFE which has a special action.

SUMMARY OF THE INVENTION

The invention has the object of providing a PTFE article, for example a PTFE membrane, which has additional desired properties, for example mechanical properties, but nevertheless retains the original structure properties of ePTFE material.

In order to achieve this object, the invention provides a PTFE article, in particular a PTFE membrane, comprising microporous, for example stretched, polytetrafluoroethylene (ePTFE) containing an inorganic filler comprising particles in the nanometer range.

These filler particles have a size of from 5 to 500 nanometers (nm), preferably from 10 to 300 nanometers. They are referred to below as "nanoparticles".

A peculiarity of nanoparticles is their extremely large surface area compared with their volume. For example, one gram of $Al_2O_3$ nanoparticles (ALCOA®) having a size of <100 nm has a total surface area of 55–80 $m^2/g$.

The special effect of nanoparticles in microporous PTFE, in particular in expanded PTFE, i.e. a very porous structure, is surprising, since firstly the structure of the microporous PTFE is retained in spite of the filler, and thus the advantageous properties of the microporous PTFE are also retained, and secondly the inorganic filler comprising nanoparticles exhibits the desired action. As explained in greater detail below, the filler participates in accordance with the invention in the generation of the node/fibril structure of the microporous PTFE. Although the filler is itself part of the structure of the PTFE article, the filler develops the desired action. This contradicts what the prior art reveals to the person skilled in the art:

A study of the novel PTFE article with the aid of a scanning electron microscope shows that the nanoparticles do not fill the pores of the porous ePTFE. Instead, the nanoparticles are part of the polymer structure, so that there is virtually no difference in the microscopic image between unfilled ePTFE and filled ePTFE.

This explains why the original structural property of the unfilled ePTFE is retained with virtually no change in spite of a significant filler content.

A filler particle diameter range between 5 and 500 nm is proposed in accordance with the invention. The lower limit of 5 nm is due to the fact that nanoparticles having smaller diameters are virtually unavailable. The upper limit of 500 nm is associated with the requirement that the filler particles should not change the structural property of unfilled ePTFE, but instead that the filler particles should be part of the structure.

If the dimensions of the fibrils in a conventional ePTFE structure are considered, filler particle diameters of greater than 500 nm would disturb the fibril structure.

A preferred upper limit for the filler nanoparticles is 300 nm. In filler particles having a diameter of below 300 nm, it is reliably ensured that the particles do not interfere with the structure of the microporous PTFE but are with certainty part of the structure. An upper limit of 100 nm is most preferred for the diameter of the filler particles. At this upper limit of 100 nm, the structure of the expanded PTFE containing filler is virtually identical with the structure of expanded PTFE without filler. Nevertheless, the filler achieves the desired additional properties of the PTFE article.

Virtually all known ePTFE materials can be used in this invention. The proportion of nanoparticles in % by weight is, for example, between 5 and 10% by weight, which achieves the desired action; for Example; a desired filtration effect at the same time as adequate material strength. In comparison with the fillers usual in the past, a lower filler content is adequate. An upper limit for the proportion of nanoparticles is 80% preferably 50% by weight, based on the sum of PTFE and filler. Above this upper limit, the properties of the filler would dominate. However, it is desired to retain the typical properties of the stretched, porous PTFE.

A suitable choice of the nanoparticle fillers allows, for example, the abrasion resistance of filter membranes to be increased. Filter membranes have the problem of cleaning after an extended operating time. Cleaning of the surface of the membrane by scraping entails the risk of damage to the membrane, in particular after repeated cleaning. If the abrasion resistance of the membrane is increased by means of a suitable additive, for example $TiO_2$, the life of the filter membrane can be increased significantly.

Incorporation of hydrophilic nanoparticles into the structure of stretched PTFE allows a significant increase in water flow rate. This is likewise particularly beneficial to membranes employed for water filtration.

The term "hydrophilic" refers to the tendency of a substance to allow penetration by water. If a water drop is placed on the surface of a substance and the contact angle formed by the water drop is measured, the term hydrophilic is used for surfaces on which the contact angle is less than 90°. The liquid, i.e. the water, wets the surface (cf. H.-D.-Dorfler "Grenzflachen" und Kolloidchemie [Interface and Colloid Chemistry], Carl Hanser, 1994). This phenomenon is caused, in particular, by active hydroxyl groups on the surface, and also by carboxyl groups, sulfonyl groups and phosphate groups. The active hydroxyl groups arise through the formation of oxides or from the synthesis.

Another example of novel PTFE articles of the invention are membranes filled with a ceramic nanoparticle material which are used in dialysis cells.

In structural terms, the filler nanoparticles in the novel PTFE article are not defects in the micorporous structure, but instead the nanoparticles retain this structure, for example node/fibril structure or rope-ladder structure, with virtually no change, since they are themselves part of this structure.

Suitable fillers are nanoparticles from the group consisting of oxides and mixed oxides, including oxides and mixed oxides whose surface has been chemically modified. For example, ferromagnetic properties can be imparted by means of nanoparticles of this type. Substances of this type can be employed for screening electrical cables or in circuit boards.

The abovementioned group "oxides and mixed oxides" includes, for example, the various aluminium hydroxides which can be prepared synthetically or occur freely in nature, for example in bauxite, in the form of boehmite, gibbsite, alumogel, etc. These substances contain various amounts of water and impurities in the form of other metal cations.

Oxides or mixed oxides are also material combinations for the production of oxide ceramic which are based, for example, on aluminium oxide with addition of BeO, MgO, $ZrO_2$ and $MgAl_2O_4$ (spinell) or alternatively ferrites, titanates, etc. The addition of these substances improves certain properties, for example the toughness.

$TiO_2$ and ZnO are suitable for rendering the PTFE membrane opaque to UV-A and UV-B radiation. ZnO is favorable as filler if a membrane for clothing is to be provided with antibacterial and antimicrobial properties.

Preferred examples of ceramic fillers are $Al_2O_3$, $TiO_2$ and $ZrO_2$.

Examples of specific properties of nanoparticles are given in EP-A-0 317 945 and DE-A41 33 621.

Other types of fillers are possible, for example nanoparticles comprising carbon (graphite) or metal. In addition, other types of fillers may be used to replace a portion of the inorganic fillers described above. Such fillers include organic polymers such fluoropolymers, e.g. copolymers of TFE and herafluoropropylene or TTFE and perfluoro (propyl vinyl ether).

The invention also provides a process for the production of an article from filled, expanded PTFE. PTFE resin is mixed with a filler in the form of particles having a size in the nanometer region; lubricant is added to the PTFE mixed with filler, and a shaped article is formed, which is paste extruded; and/or calendering; and lubricant removed. In the process of the invention, the resulting calendered material is stretched in a first direction followed by sintering, and subsequently stretched in a second direction, which is perpendicular to the first direction.

The mixing in step a can be by three different methods, namely by dispersion, dry mixing or coagulation, depending on the filler used. These three methods are described below in combination with the production of a membrane for filtration of improved abrasion resistance.

BRIEF DESCRIPTION OF THE DRAWINGS

FIGS. 1 to 8 show scanning electron photomicrographs of various ePTFE membranes with and without filler, where

DETAILED DESCRIPTION OF THE INVENTION

Mixing of Filler and PTFE by Dispersion in a Lubricant

If the nanoparticles of the filler form a stable dispersion in a lubricant to be used and do not tend toward agglomeration, the PTFE and filler are mixed by dispersing the filler in the lubricant and admixing a PTFE powder with the resultant dispersion. If the surfaces of the nanoparticles are hydrophobic, a known hydrophobic lubricant is used. Information on suitable lubricants and information on PTFE are given in the two abovementioned publications EP-A-0 463 106 and EP-A-0 437 721. In order to be able to use a hydrophobic lubricant of this type, the surfaces of the nanoparticles can be treated with long-chain organic compounds, for example carboxylic acids, in order to render them hydrophobic.

If hydrophobic and oleophobic lubricants (for example perfluoropolyethers) are used, the surfaces of the nanoparticles are rendered hydrophobic and oleophobic, for example, by treating them with organic long-chain compounds for example perfluorinated carboxylic acids and perfluoropolyethers containing functional end groups. Preferred end groups are phosphates or phosphoric acid esters, silanes, diols and polyols. Specific carboxylic acids are, for example, stearic acid, lauric acid, etc. (cf. the DEGUSSA catalogue, Japan), i.e. long-chain carboxylic acids of low water solubility, and polar organic solvents having a chain length of 10 carbon atoms or more. The hydrocarbon-based lubricants preferably have the same chain lengths, so that there is good compatibility from the chemical point of view and the carboxylic acid can be removed at comparable temperatures as lubricant.

If hydrophilic lubricants (for example surfactant solutions) are used, the surfaces of the nanoparticles must be hydrophilic. This is the case by nature for pure inorganic oxides, but can also be achieved by treating the nanoparticles with organic bifunctional surfactants, diols, dicarboxylic acids and polyelectrolytes.

Surfactant solutions can be employed as hydrophilic lubricants if they fully wet the two components PTFE on the one hand and nanoparticles on the other hand. To this end, it must be ensured that the surfactant solution has adequate viscosity and adequate surface tension, which depends on the concentration and chemical structure of the surfactants. Examples of such surfactant solutions are given in EP-A-0 418 155 (page 4, lines 14 to 17).

The lubricant must fully wet the surface of the PTFE agglomerates. Accordingly, the lubricant must have a certain surface tension and viscosity, which restricts the solids content in the dispersion. This disadvantage is compensated by using very small nanoparticles, which have a correspondingly large specific surface area.

By way of example, a filler dispersion is prepared by stirring the filler $TiO_2$ in powder form, which is used to increase the abrasion resistance, slowly into a lubricant. The lubricant is, for example, a paraffin oil to which a small amount of lauric acid has been added. As the $TiO_2$ powder is stirred in, the $TiO_2$ particles are coated by the lauric acid.

In the next step, an amount of PTFE powder is introduced into a mixer, and the $TiO_2$ dispersion is slowly metered in. This gives a free-flowing powder or granular material, from which a molding is pressed under vacuum in a manner known per se.

Mixing of Filler and PTFE by Dry Mixing

Dry mixing of PTFE and filler nanoparticles is preferred if the particle size of the PTFE material on the one hand and of the filler on the other hand are identical, no agglomeration of the components is observed and homogenization of the components is achieved by the dry mixing.

By way of example, PTFE powder is mixed with pulverulent $TiO_2$ of nanoparticle size in a mixer. Lubricant, for example the abovementioned paraffin oil with lauric acid dissolved therein, is metered into this mixture. The resultant granular material is again pressed to give a molding and processed further in the abovementioned manner.

Mixing of Filler and PTFE by Coagulation

Another way of mixing the PTFE material with the filler nanoparticles is coagulation. This is preferred if the nanoparticles form a stable aqueous dispersion, have hydrophilic properties at the surface and do not tend toward agglomeration in the aqueous medium. Coagulation is particularly preferred if the PTFE particles after coagulation have a coating comprising the nanoparticles or if the nanoparticles are to be provided with a coating of PTFE primary particles. Coagulation mechanisms are described in H.-D. Doerfler "Grenzflaechen- und Kolloidchemie" [Interface and Colloid Chemistry], VCH, Weinheim, Germany, 1994.

An aqueous dispersion of nanoparticles is prepared, and this aqueous dispersion is mixed with an aqueous dispersion of PTFE. The aqueous dispersion of PTFE is commercially available.

If PTFE dispersions and nanoparticle dispersions of the same particle size, for example 200 nm, are used, coagulation gives an extremely homogeneous distribution of the substances.

If nanoparticles having a size of about 20–40 nm are used, as mentioned in the abovementioned EP-A-0 418 155, and if the particle size of the PTFE dispersion is 200 nm, nanoparticles may accumulate at the surface of the PTFE. The principles of steric coagulation using, for example, polyelectrolytes may be used, if desired, to achieve a preferred accumulation on the surface. If, by contrast, the nanoparticles having a particle size of about 200 nm mentioned in EP-A-0 418 155 are used while the particles of the PTFE dispersions have a particle size of 20–50 nm, PTFE particles may accumulate at the surface of the nanoparticles. Here too, the principles of steric coagulation using, for example, polyelectrolytes can be used to achieve a preferred accumulation at the surface.

The mixture is caused to coagulate by addition of electrolyte and/or intensive stirring. The water is separated off, and the material is dried. Addition of lubricant gives a material from which a molding can be pressed.

Paste Extrusion and/or Calendering Followed by Stretching and Partial Sintering These steps complete formations of the products. By adjusting the stretching ratio and condition, a selected pore size can be achieved. In a node and fibril microstructure such as with stretched ePTFE, one way to measure pore size is to measure and determine the mean distance between nodes. Typically, this will be between 0.01 and 10 um.

The stretching and sintering of the material in step e) result in the formation of nodes and fibrils of PTFE, as is well known. This stretching in step e) is carried out in a certain direction (machine direction), so that the fibrils connecting the individual knots have a certain preferential direction, namely the same direction. During further processing, by employing stretching step f) a structure can be formed which can be described appropriately by the term "rope ladder". The stretched PTFE is gripped on both sides by gripper devices which have an increasing separation from one another in the direction of movement of the material web. This causes stretching of the material in the direction perpendicular to the first direction. This stretching in the secured direction causes the formation from nodes of main fibrils or fibril bundles which are oriented in the secured-direction, representing the "steps" of the rope ladder structure. In the case of PTFE filled with nanoparticles, this additional stretching operation causes further distribution of the filler particles. This causes homogenization. Relatively large filler particles would occupy the spaces between the fibrils; however, the nanoparticles are deposited in and on the surfaces of the fibrils and fibril bundles, rather than between.

The filtration membrane produced by the process outlined above is extremely thin, allows a significantly high flow rate, is more abrasion resistant than conventional membranes, but nevertheless has the same good filter properties.

One use of the filled ePTFE membrane of the invention is as use as a filter. The ePTFE membrane does not merely satisfy the function of a fine filter, but is also resistant to a cleaning tool. After a certain operating time, the surface of the ePTFE membrane, as is usual in the case of filters, is scraped to free deposits. This is usually carried out with the aid of a scraping tool which is pulled over the surface of the membrane. The abrasion resistance of the membrane thus plays an important role, and, in order to increase the abrasion resistance, the membrane is, according to the invention, filled with aluminium oxide particles or titanium oxide particles having a size in the nanometer range. As shown by the examples and comparative examples, not only is very high abrasion resistance achieved, but the tensile strength is also increased compared with conventional membranes. This is important, inter alia, for processing of the membrane during filter construction.

EXAMPLE 1

Dispersion 4000 ml of paraffin oil having a boiling point between 181° C. and 212° C. were introduced into a water-cooled colloid mill. 12 g of lauric acid and then, slowly, 600 g of aluminium oxide ($Al_2O_3$) (Alpha UFX-MAR from Chemag; particle size $d_{50}$=200 nm) were then added with stirring. This dispersion was metered, over the course of 10 minutes, into 11.4 kg of PTFE polymer made by the emulsion process (molecular weight >$10^7$, prepared as described in EP-A-0 170 382) in a solid/liquid mixer (Patterson Kelly), and mixing was continued for a further 10 minutes.

A prepressing in the form of a pellet was produced from this mixture under vacuum at 1.0–1.5 MPa.

A film (tape) was then formed by paste extrusion. This film was calendered to the desired thickness with the aid of heated rolls (see Table 1 below, Examples 1.1 to 2.4). The lubricant was removed thermally. To this end, the film after the calendering step, was passed over heated rolls (240° C.–250° C.). The film was then stretched (200%/s) in the machine direction at 240° C. and partially sintered at temperatures of >330° C., giving a uniaxially stretched tape having the typical expanded node/fibril structure. The properties of this tape material are shown in Table 2.

EXAMPLE 2

Dispersion

A filled tape was produced as described in Example 1, but with the 600 g of aluminium oxide replaced by titanium dioxide (R-320 from Hombitan; particle size $d_{50}$=200–300 nm). The properties of this material are likewise shown in Tables 1 and 2.

EXAMPLE 3

Dispersion 400 ml of a lubricant comprising one part of isopropyl alcohol and two parts of polypropylene glycol were introduced into a water-cooled colloid mill. 1200 g of aluminium oxide (A16SG from Alcoa; particle size $d_{50}$=300 nm) were added with stirring. This dispersion was metered over the course of 10 minutes into 10.8 kg of PTFE emulsion polymer (molecular weight >$10^7$, prepared as described in EP-A-0 170 382) in a solid/liquid mixer (Patterson Kelly), and mixing was continued for a further 10 minutes. A pellet was produced from this mixture under vacuum at 1.4–1.5 MPa. A film (tape) was then formed by paste extrusion and was calendered to the desired thickness by means of heated rolls (cf. Table 1). The lubricant was removed thermally by passing the film over heated rolls (240° C.–250° C.). The film was then stretched (200%/s) in the machine or working direction at 240° C. and partially sintered at temperatures of >330C, giving a uniaxially stretched tape having an expanded node/fibril structure of PTFE. The properties are shown in Table 2.

COMPARATIVE EXAMPLE A

Containing No Nanoparticles 3460 ml of paraffin oil having a boiling point of from 181° C. to 212° C. were metered over the course of 10 minutes into 12.0 kg of PTFE emulsion polymer (molecular weight >$10^7$, prepared as described in EP-A-0 170 382) in a solid/liquid mixer (Patterson Kelly), and mixing was continued for a further 20 minutes. A pellet was produced from this mixture under vacuum at from 1.4 to 1.5 MPa. A film (tape) was then obtained by paste extrusion and was calendered to the desired thickness by means of heated rolls (cf. Table 1). The lubricant was removed thermally by passing the film over heated rolls (240° C.–250° C.). The film was then stretched (200%/s) in the machine direction at 240° C. and partially sintered at 356° C., giving a unidirectionally stretched tape having a typical expanded node/fibril structure. The properties are shown in Tables 1 and 2.

TABLE 1

Uniaxial stretching - sintering of the films

| Film | Run | Thickness after calendering in μm | Stretching ratio |
| --- | --- | --- | --- |
| Example 1 | | | |
| PTFE | 1.1 | 284 | 3.5:1 |
| 5% $Al_2O_3$ | 1.2 | 147 | 3.5:1 |
| | 1.3 | 70 | 3.5:1 |
| | 1.4 | 38 | 5:1 |
| Example 2 | | | |
| PTFE + | 2.1 | 280 | 3.5:1 |
| 5% $TiO_2$ | 2.2 | 143 | 3.5:1 |
| | 2.3 | 84 | 3.5:1 |
| | 2.4 | 45 | 5:1 |
| Comparative example | A1 | 282 | 3.5:1 |
| PTFE | A2 | 153 | 3.5:1 |
| | A3 | 75 | 3.5:1 |
| | A4 | 65 | 5:1 |
| Example 3 | | | |
| PTFE + 10% $Al_2O_3$ | 3 | 153 | 2.0:1 |

TABLE 2

Structural properties of the uniaxially stretched films

| Film | | Enthalpy of melting J/g | Melting range ° C. | MFP* μm |
| --- | --- | --- | --- | --- |
| Example 1 | | | | |
| PTFE + | 1.1 | 61.9 | 347.4–342.2 | 0.6 |
| $Al_2O_3$ | 1.2 | 55.2 | 346.4–340.4 | 0.6 |
| (5%) | 1.3 | 39.8 | 341.1–338.0 | 0.6 |
| | 1.4 | 30.3 | 334.7–344.4 | 1.0 |
| Example 2 | | | | |
| PTFE + | 2.1 | 61.2 | 346.7–339.7 | 0.3 |
| $TiO_2$ (5%) | 2.2 | 5O.5 | 346.4–339.7 | 0.6 |
| | 2.3 | 37.2 | 337.6 | 0.4 |
| | 2.4 | 25.8 | 333.5 | 1.1 |
| Comparative example | A1 | 61.4 | 345.6 | 0.36 |
| PTFE | A2 | 54.4 | 346.1–339.8 | 0.5 |
| | A3 | 36.8 | 337.3 | 0.4 |
| | A4 | 30.0 | 334.1–345.2 | 0.7 |
| Example 3 + | | | | |
| $Al_2O_3$ (10%) | 3 | 34.4 | 336.0 | 0.53 |

*(mean pore diameter)

A comparison of the properties of the films produced in accordance with the above examples and Comparative Example A shows that membranes produced using nanoparticle fillers have roughly similar pore sizes as membranes without filler. This means that the same specific advantages are achieved using these membranes as have also been achieved hitherto using unfilled PTFE membranes. Moreover, there are additional specific advantages owing to the filler. Mention is also made below of these properties.

EXAMPLE 4

The films produced in accordance with Examples 1 and 2 above and in accordance with Comparative Example A were stretched a second time transversely to the machine direction after the production procedure. This stretching operation was carried out in said transverse direction at temperatures above the crystalline melting point of the films (cf. "melting range" column in Table (2)). The stretching ratio was from 5:1 to 10:1.

TABLE 3

Properties of the biaxially stretched films

| Film | | Thickness in μm | Stretching ratio | Rate m/min | Melting Range ° C. | MFP μm | MTS (T) N/$mm^2$ | MTS* (M) N/$mm^2$ |
| --- | --- | --- | --- | --- | --- | --- | --- | --- |
| Comparative Example A | 4A1 | 60 | 10:1 | 5 | 340.1–328.9 | 0.7 | 82 | 64 |
| | 4A2 | 24 | 10:1 | 5 | 345.3 | 0.8 | 152 | 67 |
| | 4A3 | 11 | 10:1 | 20 | 338.9 | 1.0 | 260 | 83 |
| | 4A4 | 7 | 10:1 | 20 | 339.7 | 1.1 | 108 | 144 |
| 5% $Al_2O_3$ | 4.1.1. | 50 | 10:1 | 15 | 333.3 | 0.8 | 80 | 52 |
| | 4.1.2. | 20 | 10:1 | 20 | 334.8 | 0.8 | 120 | 59 |
| | 4.1.3. | 8 | 10:1 | 20 | 341.1–335.6 | 1.5 | 171 | 75 |
| | 4.1.4. | 2–3 | 10:1 | 5 | 335.2 | 1.4 | 116 | 183 |

TABLE 3-continued

Properties of the biaxially stretched films

| Film | | Thickness in μm | Stretching ratio | Rate m/min | Melting Range ° C. | MFP μm | MTS (T) N/mm² | MTS* (M) N/mm² |
|---|---|---|---|---|---|---|---|---|
| 5% TiO₂ | 4.2.1. | 55 | 10:1 | 20 | 339.2–329.2 | 0.8 | 166 | 62 |
| | 4.2.2. | 16 | 10:1 | 20 | 336.4 | 0.5 | 68 | 152 |
| | 4.2.3. | 13 | 10:1 | 20 | 340.4 | 1.5 | 222 | 106 |
| | 4.2.4. | 5–6 | 5:1 | 20 | 337.2–331.7 | 1.5 | 86 | 259 |

[1] Machine speed
[2] Matrix tensile strength (transverse)
[3] Matrix tensile strength (machine)

The results from Table 3 show that in general the tensile strength increases as the samples get thinner until finally the samples are so thin that good measurement cannot be obtained.

Figure 1A:
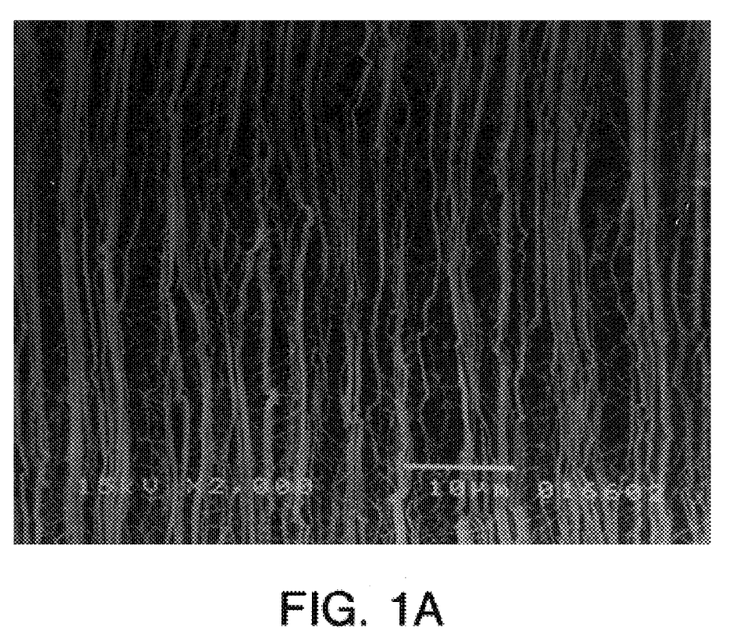
FIGS. 1A and 1B show an unfilled ePTFE membrane at a magnification of 2000× and 3500× respectively.
Figure 1B:
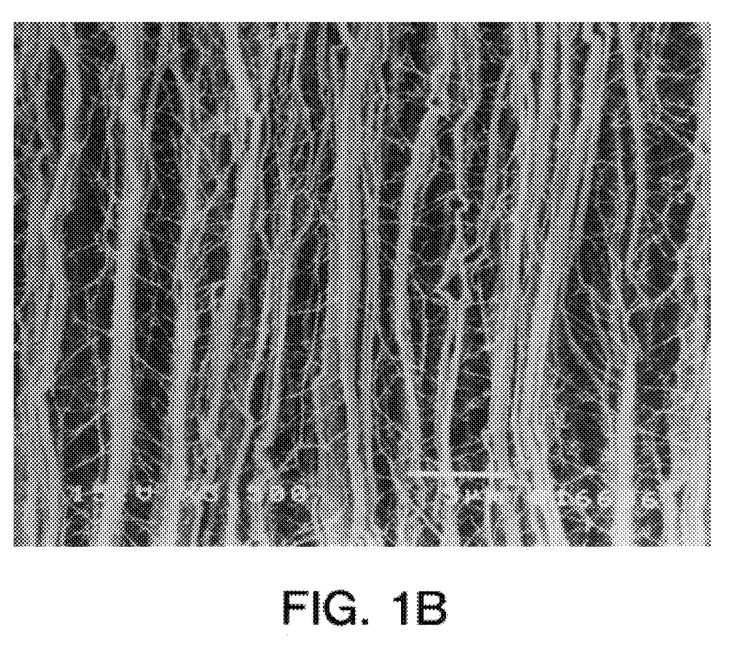
Figure 2A:
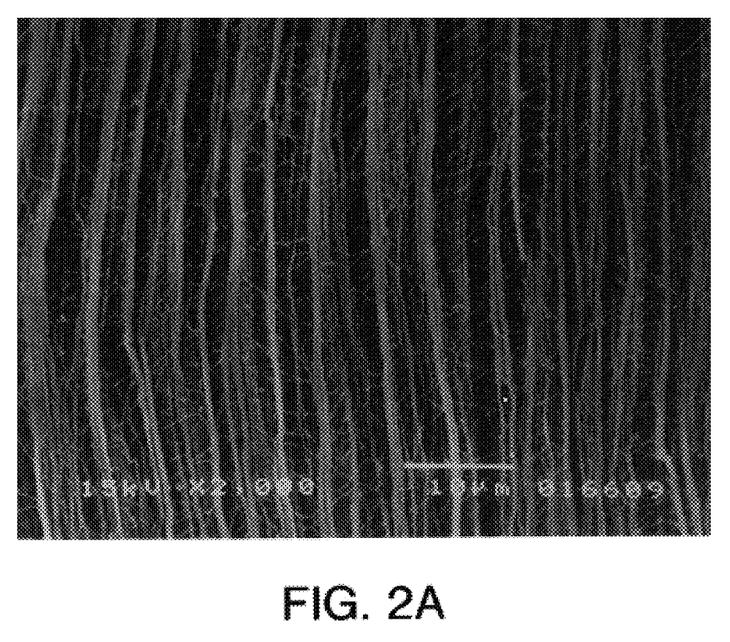
FIGS. 2A and 2B show an ePTFE membrane containing 5% of $Al_2O_3$ filler in the form of nanoparticles at a magnification of 2000× and 3500× respectively.
Figure 2B:
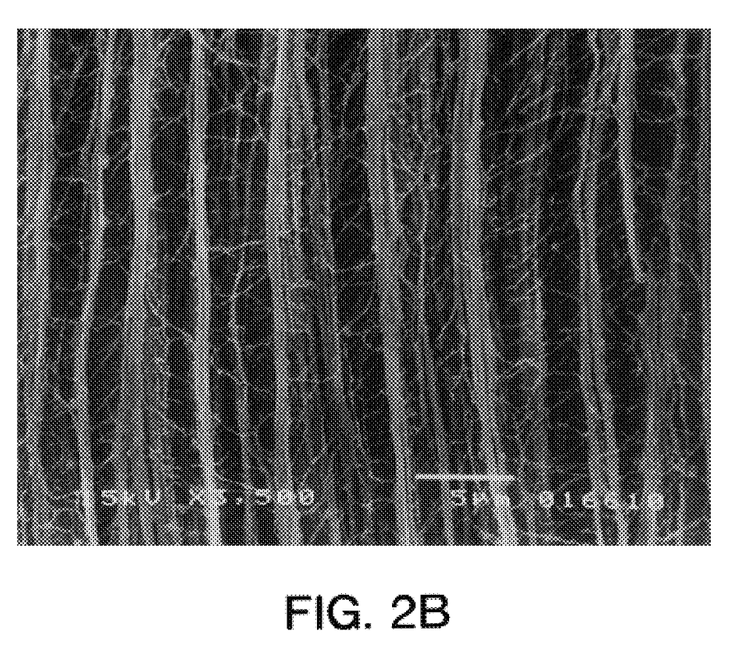
Figure 3A:
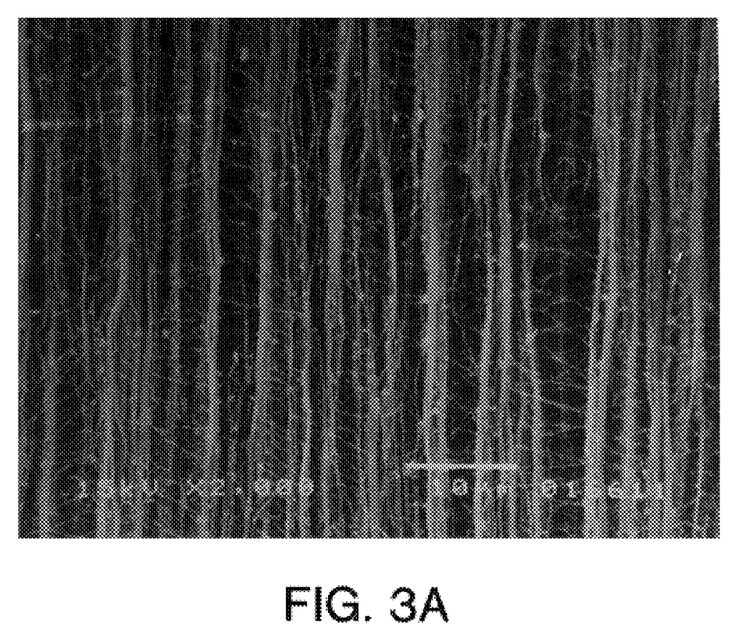
FIGS. 3A and 3B show an ePTFE membrane containing 5% of $TiO_2$ filler in the form of nanoparticles at a magnification of 2000× and 3500× respectively.
Figure 3B:
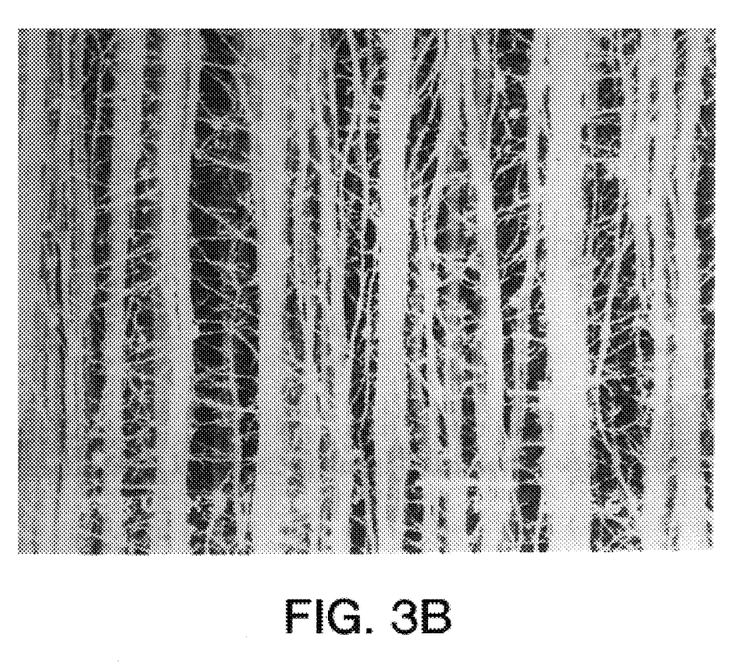

This is also clear from a comparison of FIGS. 1, 2 and 3

FIGS. 1A and 1B show a scanning electron photomicrograph of an ePTFE membrane without filler. The fibril structure extending vertically through the two pictures is clearly evident.

FIGS. 2A and 2B show different magnifications (2000× and 3500× respectively) of a similar ePTFE membrane, but here with a nanoparticle filler, namely 5%. Al₂O₃, prepared as described in Example 4 above. A comparison of FIGS. 1 and 2 clearly shows that the structure of the membrane is virtually unchanged in spite of the filler.

The same applies to the structure, shown in FIGS. 3A and 3B of an ePTFE membrane in which the nanoparticle filler comprises 5%. of TiO₂. Here too, the structure is virtually unchanged compared with the unfilled ePTFE.

Small, thin, transverse fibrils are located between the relatively thick, vertical fibril bundles formed by the second stretching operation (transverse to the machine direction). In other words, the thick, main fibrils running from top to bottom in the drawing are linked to one another in the transverse direction.

EXAMPLE 5

Figure 4A:
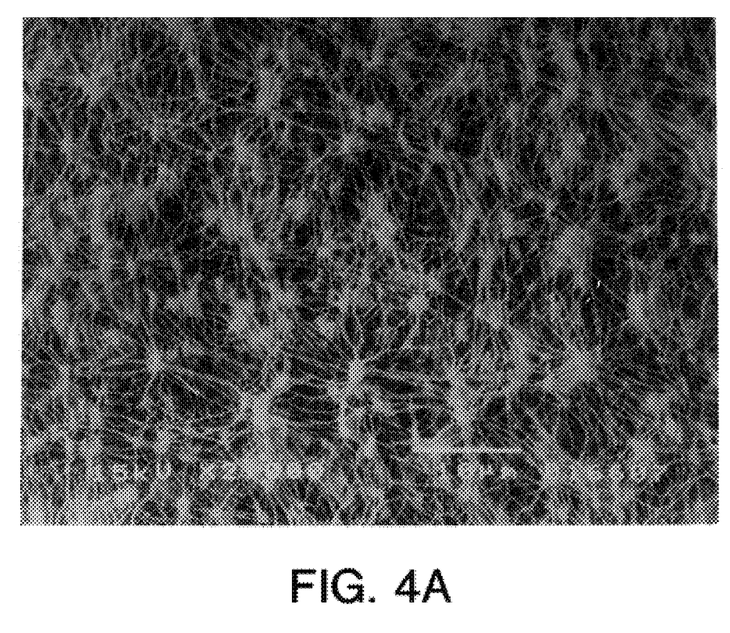
FIGS. 4A and 4B show a biaxially stretched ePTFE membrane without filler at a magnification of 2000× and 3500× respectively.
Figure 4B:
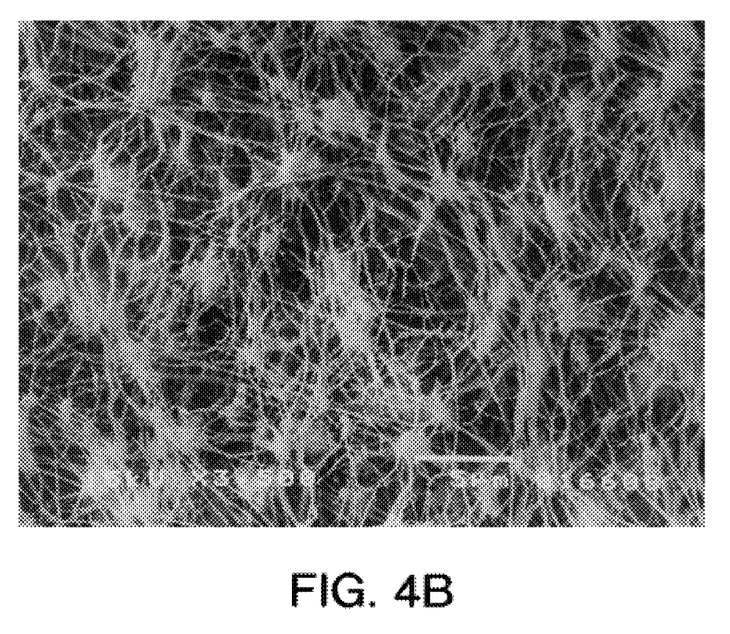
Figure 5A:
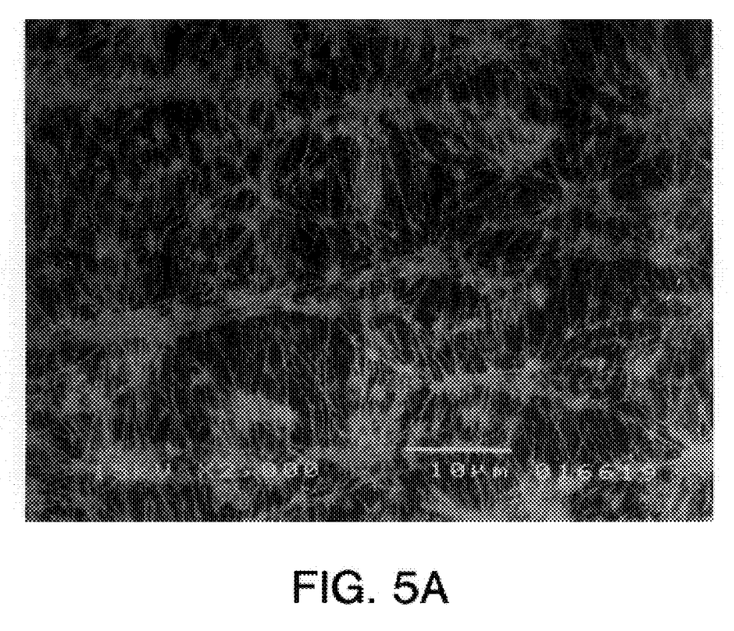
FIGS. 5A and 5B show a biaxially stretched ePTFE membrane containing 5% of $Al_2O_3$ filler in the form of nanoparticles at a magnification of 2000× and 3500× respectively.
Figure 5B:
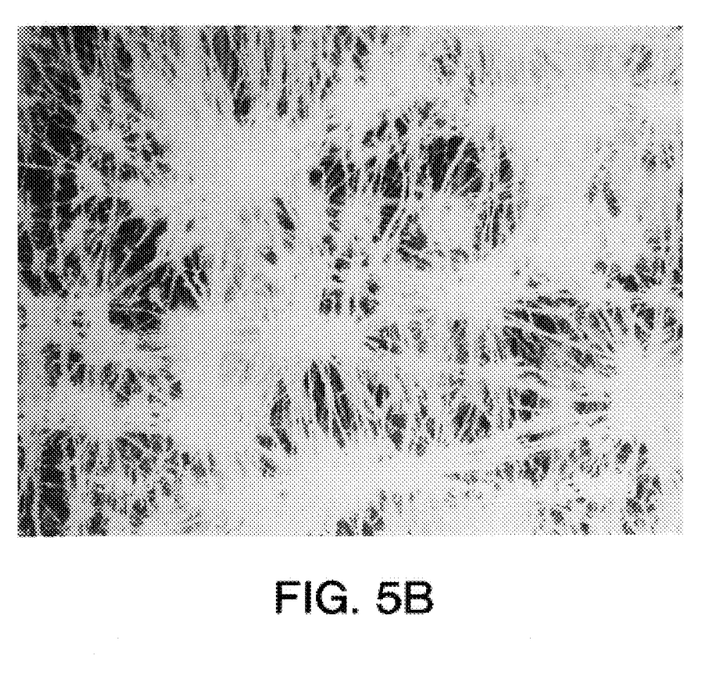

The procedure was as in Example 1, but the stretching was not carried out unidirectionally, but instead biaxially in sequence. In contrast to the above Example 4, however, the stretching was not carried out above the crystalline melting point, but instead below it. After stretching, the film was sintered, giving the known structure of expanded, porous PTFE as shown in FIG. 5. A comparison between FIGS. 4 and 5 shows virtually no differences in structure. FIG. 4 being ePTFE without filter. This is evidence that the nanoparticles are part of the original ePTFE structure.

EXAMPLE 6

Figure 6A:
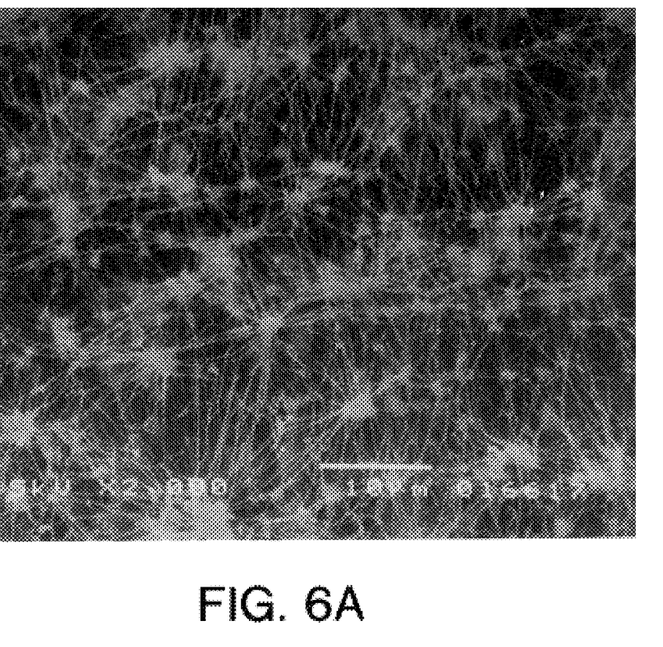
FIGS. 6A and 6B show a biaxially stretched ePTFE membrane containing 5% of $TiO_2$ filler in the form of nanoparticles at a magnification of 2000× and 3500× respectively.
Figure 6B:
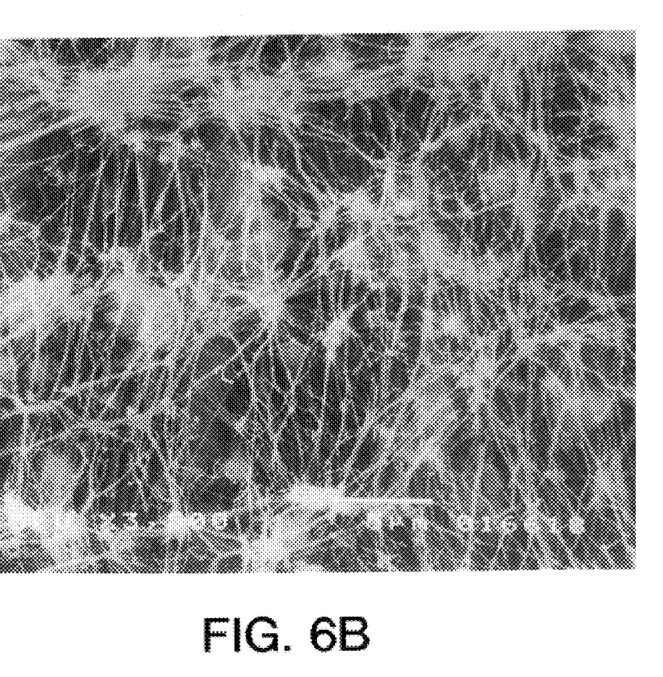

The procedure was as in Example 2, but, as in the above Example 5, likewise with biaxial stretching at temperatures below the crystalline melting point. The film having the structure shown in FIG. 6 was thus obtained.

COMPARATIVE EXAMPLE B

As in Examples 5 and 6 above, Comparative Example A was also modified by carrying out biaxial stretching at below the crystalline melting point. The resultant structure of the PTFE membrane is shown in FIG. 4.

EXAMPLE 7

Coagulation 540 g of demineralized water were introduced into a beaker. A pH of 2–3 was established by means of HCl. 19.5 g of aluminium oxide having a particle size of $d_{50}$=13 nm (Degussa) were slowly added with stirring. The Al₂O₃ dispersion was added to 740.5 g of a 23.7% by weight PTFE dispersion. 24.4 ml of 0.5% Sedipur solution (BASF) were added, and coagulation of the mixture was achieved with stirring. The solid was filtered off and dried at 165° C. for 8 hours.

Figure 7:
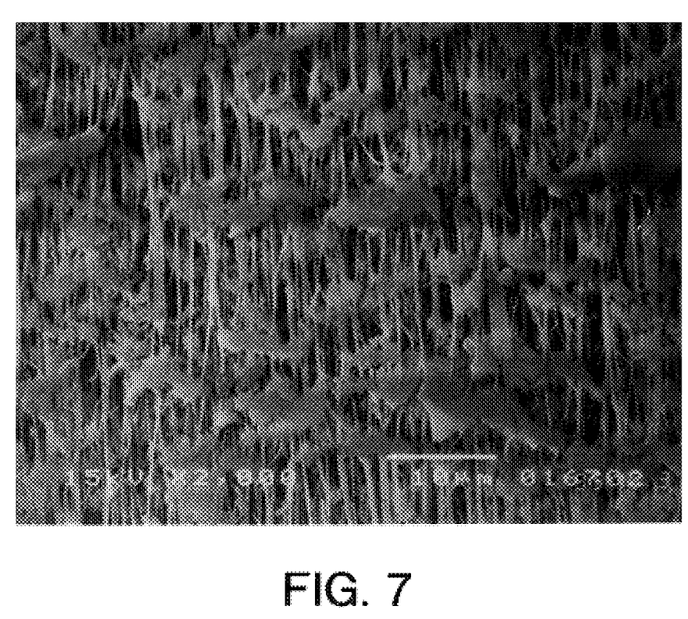
FIG. 7 shows an ePTFE structure containing 10% of $Al_2O_3$ filler in the form of nanoparticles produced by coagulation.

17.5 ml of paraffin oil were added to 56.7 g of the mixture, and a molding was produced by pressing the material at 0.35 MPa. Subsequent paste extrusion at 15.0 MPa followed by thermal removal of the lubricant at 250° C. and stretching at about 300° C. (25:1) at a rate of about 1000%/s gave a film whose structure is shown in FIG. 7. The experiment was repeated using a different aluminium oxide (Al6 SG, Alcoa). The coagulant used was a 25%. aluminium nitrate solution (see Table 4). The experiment was reheated again replacing 5%. of the aluminium oxide by a PFA dispersion (tetrafluoroethylene- perfluoropropyl vinyl ether copolymer, Hoechst AG, particle size $d_{50}$ about 50 nm) (Table 4).

The experiment was repeated again using only a PTFE dispersion without filler (cf. Table 4).

EXAMPLE 8

Dry mixing 113.4 g of a mixture of ten parts of aluminium oxide (particle size $d_{50}$=13 nm; Degussa) and 90 parts of PTFE emulsion polymer (molecular weight >10⁷, prepared as described in EP-A-0 170 382) were mixed with 60 ml of paraffin oil. The mixture was used to produce a molding by pressing at 0.35 MPa. This was followed by paste extrusion at 34.0 MPa. The lubricant was removed thermally at 250° C. Subsequent stretching was carried out at about 300° C. (25:1) at a rate of approximately 1000%/s.

COMPARATIVE EXAMPLE C 113.4 g of a mixture of ten parts of aluminium oxide (ZS203 from Martinswerk, alpha form of aluminium oxide, $d_{50}$ about 3 μm) and 90 parts of PTFE emulsion polymer (molecular weight >10⁷, prepared as described in EP-A-0 170 382) were mixed with 40 ml of paraffin oil. The mixture was used to produce a molding by pressing at 0.35 MPa. This was followed by paste extrusion at 19.0 MPa. The lubricant was removed thermally at 200° C. Subsequent stretching was carried out at about 300° C. (25:1) at a rate of approximately 1000%/s.

Figure 8:
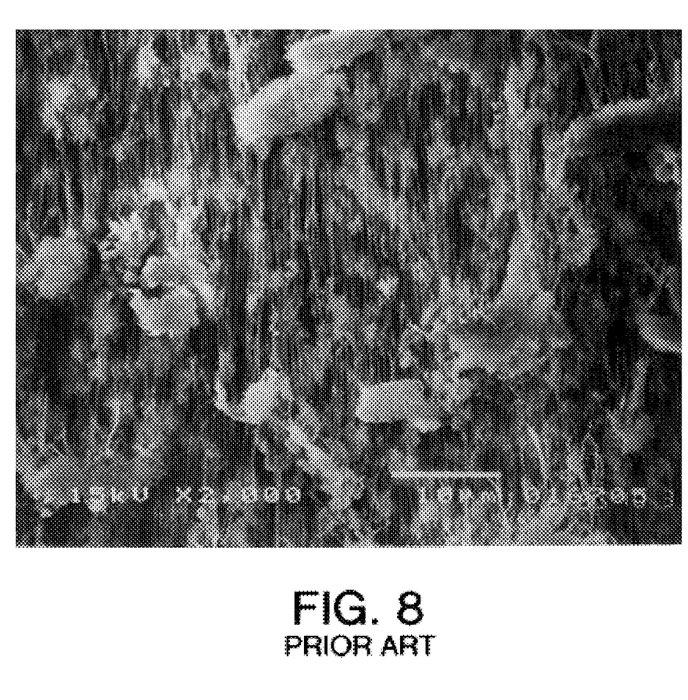
FIG. 8 shows an ePTFE structure containing 10% of $Al_2O_3$ filler, where the filler comprises particles having a size in the micron range in accordance with the prior art.

The particles of the filler are clearly visible in the scanning electron photomicrograph, as FIG. 8. The filler particles, which have a size in the order of a few microns, have destroyed the original EPTFE structure.

TABLE 4

Properties of the uniaxially stretched films shown in

| Composition | | Extrusion Pressure MPa | Density of the stretched films in g/cm³ | Elongation at break % | MTS N/mm² |
|---|---|---|---|---|---|
| Example 7 | PTFE | 16.5 | 0.33 | 59 | 94 |
| | 10% Degussa | 16.0 | 0.23 | 67 | 77 |
| | 10% A16SG | 18.5 | 0.37 | 74 | 80 |
| | 5% A16SG + 5% PFA | 16.5 | 0.22 | 73 | 85 |
| Example 8 | 10% Degussa | 24.0 | 0.30 | 42 | 84 |
| Comparative Example C | 10% ZS 203 | 19.0 | 0.17 | 36 | 56 |

* Thermogravimetric analysis showed 9.99 per cent by weight of aluminium oxide

TESTS

The membranes produced as described in the above examples were subjected to a Martindale abrasion resistance test (pilling method with wool)(test procedure in accordance with Swiss Standard SN 198525). A membrane from Comparative Example A was compared with a membrane filled with TiO₂ (5%). The membrane filled with TiO₂ had five times the resistance to abrasion: the membrane of the comparative example withstood 250 cycles of the abrasion test, while the membrane filled with TiO₂ withstood 1210 cycles. The membrane thickness was from 4 to 7 μm.

The tensile strength was tested using an Instron Corporation Series IX Automatic Testing System 1.09 in accordance with DIN 53888. The samples had a width of 15 mm. The distance between the clamps was 50 mm. The sample was stretched at a rate of 100 mm/min at 20° C. and 65% humidity. The machine recorded the elongation and force immediately before break. The matrix tensile strength was then determined.

Matrix Tensile Strength

By definition, the tensile strength of a material is the maximum tensile stress, expressed in force per unit cross-sectional area of the specimen, which the specimen will withstand without breaking.

For porous polymeric materials, the cross-sectional area of solid polymer within the polymeric matrix is not the cross-sectional area of the porous specimen, but is equivalent to the cross-sectional area of the porous specimen multiplied by the fraction of solid polymer within that cross-section. This fraction of solid polymer within the cross-section is equivalent to the ratio of the density of the porous specimen itself divided by the density of the solid polymeric material which makes up the porous matrix.

Thus to compute matrix tensile strength of a porous specimen, one divides the maximum force to break the sample by the cross-sectional area of the porous specimen, and then multiplies this quantity by the ratio of the density of the solid polymer divided by the density of the porous specimen. Equivalently, the matrix tensile strength is obtained by multiplying the tensile strength computed by the above definition by the ratio of the densities of the solid polymer to the porous product.

The molecular weight was determined from the following formula:

$$MW* = 0.597 \log_{10}\left[\frac{0.157^{-1}}{2.306 - SSG}\right] \times 10^6$$

where SSG=specific gravity of PTFE. The SSG can be calculated in accordance with ASTM standards D 1457-62 T and D747-60T.

*R. C. Doban et al American Chemical Society Meeting in Atlantic City, N.J.—September 1956.

The data for the particle size of commercially available inorganic substances were obtained from the manufacturer's data sheets.

Measurement of the Mean Pore Diameter (mean flow pore size MFP)

A sample membrane with a diameter of 25 mm was wetted with perfluoropolyether. The wetted membrane was introduced into a Coulter porometer for determination of the mean pore diameter of the end product.

Thermoanalysis DSC—Differential Scanning Calorimetry

The DSC method was used to investigate changes in the melting behavior as a function of processing. The measurements were carried out using a Perkin Elmer DSC 7 instrument calibrated in accordance with an In and Pb standard (measurement temperature range: 200–400° C., cycle: initial warming—cooling—second warming; heating rate: 10 K/min, atmosphere: pure nitrogen; sample weight; about 10.0 mg for ePTFE). The melting behavior of ePTFE was characterized using the melting point Tmax in the first warming (cf. Tables 2 and 3).

Investigation By Scanning Electron Microscopy (SEM):

A membrane sample was sputtered with gold and measured under vacuum under a scanning electron microscope. The scanning electron microscope was a Jeol JSM4500 instrument available from Contron Electronik, Germany.

EXAMPLE 9

Coagulation Hydrophilic Membrane 26.3 kg of aqueous high-molecular-weight PTFE dispersion (E.I. DuPont de Nemours Co., Inc.) were diluted with 10 l of water, and the mixture was added to a dispersion of 300 g of aluminium oxide (aluminium oxide C, Degussa, $d_{50}$=13 nm) in 23.4 l of water. The pH of the dispersion having a solids content of 10 per cent by weight was 3. This mixture was coagulated by vigorous stirring. After complete coagulation, the solid was freed from water by filtration, washed and dried in a fan-assisted oven for 24 hours. After drying, the residual water content was <0.2 per cent by weight, and the aluminium oxide content was determined as being 4.6 per cent by weight. An aliphatic hydrocarbon was added to 5.87 kg of the composite so that the proportion of lubricant boiling at from 170° C. to 210° C. was 22.1 per cent by weight. A cylindrical pellet was shaped therefrom under pressure and extruded through a flat-film die, giving a tape with a thickness of about 660 μm and a width of 16.5 cm. This tape was calendered to a thickness of 150 μm by means of rolls. After thermal removal of the lubricant, the extruded and calendered tape was stretched at a ratio of 3:1 in the machine direction at 250° C. and heat-set by passing the material over heated rolls (350° C.). This expanded tape was stretched transversely in a ratio of 5:1 in an oven heated to 360° C. to give a membrane. The same process was repeated by producing a comparative membrane under identical conditions from a PTFE dispersion and membranes having aluminium oxide contents of 9.3, 12.6 and 17.8 per cent by weight. The membrane properties are shown in the table.

TABLE 5

Determination of the water entry pressure and water vapor permeability of hydrophilized tapes

| Membrane | Thickness $\mu$m | WEP[1] [MPa] | MFP[2] $\mu$m | MVTR g/m2 24 h |
|---|---|---|---|---|
| Example 9 PTFE | 27 | 0.23 | 0.58 | >75,000 |
| Example 9 PTFE + 4.6 percent by weight $Al_2O_3$ | 30 | 0.20 | 0.60 | >75,000 |
| Example 9 PTFE + 9.3 percent by weight $Al_2O_3$ | 26 | 0.19 | 0.58 | >75,000 |
| Example 9 PTFE + 12.6 percent by weight $Al_2O_3$ | 27 | 0.15 | 0.56 | >75,000 |

WEP[1] water entry pressure
MFP[2] mean flow pore size

EXAMPLE 10

Coagulation 31.9 kg of aqueous high-molecular-weight PTFE dispersion (E.I. DuPont de Nemours Co., Inc.) were diluted with 8.1 l of water, and the mixture was added to a dispersion of 800 g of titanium dioxide (TTO-51 A, Ishihara Sangyo Kaisha, Ltd., $d_{50}$20 nm) in 30.0 l of water. The pH of the dispersion having a solids content of 12 per cent by weight was 3. This mixture was coagulated by vigorous stirring. After complete coagulation, the solid was freed from water by filtration, washed and dried in a fan-assisted oven for 24 hours. After drying, the residual water content was <0.2 per cent by weight, and the titanium dioxide content was determined as being 8.3 per cent by weight. An aliphatic hydrocarbon was added to the composite so that the proportion of lubricant boiling at from 170° C. to 210° C. was 0.47 l/kg. A cylindrical pellet was shaped therefrom under pressure and extruded through a flat-film die, giving a tape with a thickness of about 660 $\mu$m and a width of 16.5 cm. This tape was calendered to a thickness of 150 $\mu$m by means of rolls. After thermal removal of the lubricant, the extruded and calendered tape was stretched at a ratio of 3:1 in the machine direction at 250° C. and heat-set by passing the material over heated rolls (350° C.). This expanded tape was stretched transversely in a ratio of 5:1 in an oven heated to 360° C. to give a membrane.

EXAMPLE 11

Coagulation 23.9 kg of aqueous high-molecular-weight PTFE dispersion (E.I. DuPont de Nemours Co., Inc.) were diluted with 6.0 l of water, and the mixture was added to a dispersion of 600 g of titanium dioxide (Hombitan % 320, Sachtleben Chemie; $d_{50}$=200–300 nm) in 24.5 l of water. This mixture was coagulated by vigorous stirring. After complete coagulation, the solid was freed from water by filtration, washed and dried in a fan-assisted oven for 24 hours. After drying, the residual water content was <0.2 per cent by weight, and the titanium dioxide content was determined as being 7.9 per cent by weight. An aliphatic hydrocarbon was added to the composite so that the proportion of lubricant boiling at from 170° C. to 210° C. was 0.300 l/kg. A cylindrical pellet was shaped therefrom under pressure and extruded through a flat-film die, giving a tape with a thickness of about 664 $\mu$m and a width of 16.5 cm. This tape was calendered to a thickness of 150 $\mu$m by means of rolls. After thermal removal of the lubricant, the extruded and calendered tape was stretched at a ratio of 3:1 in the machine direction at 250° C. and heat-set by passing the material over heated rolls (350° C.). This expanded tape was stretched transversely in a ratio of 5:1 in an oven heated to 360° C. to give a membrane. As can be seen from Table 6, addition of about 8% of $TiO_2$ having a particle size of 20 to 300 nm to PTFE membranes provides reliable protection against UV rays. The UV transparency in the range mentioned is zero.

TABLE 6

UV transparency of PTFE composite membranes

| Membrane | Thickness $\mu$m | UV Behavior |
|---|---|---|
| Example 9 PTFE | 27 | UV-transparent in the range from 250 to 400 nm |
| Example 10 PTFE + 8.3 percent by weight $TiO_2$ | 22 | UV-opaque i.e., resistant in the range from 250 to 380 nm |
| Example 11 PTFE + 7.9 percent by weight $TiO_2$ | 24 | UV-opaque i.e., resistant in the range from 250 to 380 nm |

Experimental conditions:

Instrument: Perkin Elmer Lambda 19
Wavelength range: 250–810 nm
Speed: 120 nm/min; slit width 1.00 nm; 1 data point recorded per 0.4 nm
Smoothing: 1.00

The samples were measured in transmission by stretching them taughtly over the exit region of the cell holder. Base line compensation was carried out.

Production of a Printed Round Cable

A tape produced as described in Example 11, having a thickness of 100 $\mu$m after calendering and a titanium dioxide content of 7.8 per cent by weight, is used to produce a round cable. To this end, the tape is wound around a conductor having a diameter of 1.016 mm (20 AWG: American wire gauge) until the wall thickness of the insulation has reached 0.25 mm. This cable is inscribed with the aid of a UV excimer laser (Spectrum Technologies). Comparison of the cable inscription with the inscription of a cable produced in U.S. Pat. No. 5,501,827 demonstrates the excellent contrast. The improved contrast is attributable to the use of finely divided particles in the PTFE matrix (U.S. Pat. No. 5,501,827 uses $TiO_2$ having a particle size of between 1 and 12 $\mu$m).

EXAMPLE 12

Coagulation 24.9 kg of aqueous high-molecular-weight PTFE dispersion (E.I. DuPont de Nemours Co., Inc.) were diluted with 10.0 l of water, and the mixture was added to a dispersion of 300 g of zirconium dioxide (development product, Degussa, $d_{50}$=30 nm) in 24.8 l of water. This mixture was coagulated by vigorous stirring. After complete coagulation, the solid was freed from water by filtration, washed and dried in a fan-assisted oven for 24 hours. After drying, the residual water content was <0.2 per cent by weight, and the zirconium dioxide content was determined as being 5.3 per cent by weight. An aliphatic hydrocarbon was added to the composite so that the proportion of lubricant ,boiling at from 170° C. to 210° C. was 0.282 l/kg. A cylindrical pellet was shaped therefrom under pressure and extruded through a flat-film die, giving a tape with a thickness of about 660 μm and a width of 16.5 cm. This tape was calendered to a thickness of 150 μm by means of rolls. After thermal removal of the lubricant, the extruded and calendered tape was stretched at a ratio of 3:1 in the machine direction at 250° C. and heat-set by passing the material over heated rolls (350° C.). This expanded tape was stretched transversely in a ratio of 5:1 in an oven heated to 360° C. to give a membrane. The same process was repeated by producing, under identical conditions, membranes having zirconium dioxide contents of 9.3 and 12.6 per cent by weight.

Abrasion tests were carried out which confirm that PTFE composites cause an improvement in abrasion behavior.

TABLE 7

Abrasion behavior of PTFE membranes

| Membrane | Thickness um | Abrasion Cycles |
| --- | --- | --- |
| Example 9 PTFE | 27 | 750 |
| Example 12 PTFE + 9.3 percent by weight ZrO$_2$ | 35 | 1750 |

* Martindale abrasion test in accordance with DIN 53863. The felt underlay was wool, load 12 kPa; The figures show the number of cycles that the membranes survives without a hole forming.

The hole formation was determined by means of a Suter test:

The abraded sample is placed on a clamping ring, a piece of thin blotting paper is placed on top in order to assess wetting, and fixed by means of a clamping device. The test is carried out at a water pressure of 0.05 MPa for 2 minutes. Any wetting is evidence that the sample has been abraded through and has failed the test.

TABLE 8

| | Thickness um | Weight Loss |
| --- | --- | --- |
| Example 9 Extruded and Calendered PTFE tape | 150 | 1.6 |
| Example 10 Extruded and calendered PTFE tape + 8.3% TiO$_2$ | 150 | 0.7 |

**After 5000 cycles, the weight loss is determined by weighing.

What is claimed is:

1. Process for the production of particulate filled, microporous polytetrafluoroethylene (PTFE), comprising a) stretching a tape of a mixture of PTFE resin and 5–50% by weight of a particulate having an average particle size of between 5 and 100 nanometers, to form a microporous film;

b) sintering the tape;

c) stretching the tape in a direction substantially perpendicular to the stretching in step a) to form a microporous membrane of expanded PTFE having a thickness less than 55 micrometers, a filler loading of 5–50% by weight, and wherein the membrane has a structure of PTFE nodes and fibrils with the filler being within the PTFE nodes and fibrils rather than in the pores.

2. Process of claim 1 in which the particulate is selected from oxides or mixtures of oxides.

3. Process of claim 1 in which the particulate comprises Al$_2$O$_3$, TiO$_2$, ZnO or a metal.

4. Polytetrafluoroethylene article consisting essentially of a single membrane of expanded microporous polytetrafluoroethylene of a thickness less than 55 micrometers having particulate of an average particle size of between 5 and 100 nanometers present in an amount of 5–50% by weight based on the total weight of the membrane, wherein the membrane has a structure of PTFE nodes and fibrils with the filler being within the PTFE nodes and fibrils rather than in the pores.

5. The article of claim 4 in which the particulate particles have a surface area of 55–80 m$^2$/g.

6. The article of claim 4 wherein the particulate is carbon.

7. The article of claim 4 wherein the particulate is selected from the group consisting of Al$_2$O$_3$, TiO$_2$, ZnO$_2$, ZrO$_2$ and a metal.

8. The article of claim 4 wherein the particulate is Al$_2$O$_3$.

9. The article of claim 4 wherein the particulate is ZnO$_2$.

10. The article of claim 4 wherein the particulate is ZrO$_2$.

11. The article of claim 4 wherein the particulate is a metal.

12. The article of claim 4 wherein the amount of particulate is between 5–10% by weight.

13. The article of claim 12, wherein said particulate comprises carbon.

14. The article of claim 4 which is not UV transparent in the range of 250–350 nm.

15. The article of claim 4 wherein the water entry pressure is less than 0.2 at a mean flow pore size of 0.6 micrometer.

* * * * *